United States Patent
Kawabata

(10) Patent No.: US 10,398,051 B2
(45) Date of Patent: Aug. 27, 2019

(54) SOCKET HAVING A TERMINAL UNIT ASSEMBLY ACCOMMODATED WITHIN A RECESS OF A FRAME MEMBER

(71) Applicant: Molex, LLC, Lisle, IL (US)

(72) Inventor: Masato Kawabata, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/018,500

(22) Filed: Jun. 26, 2018

(65) Prior Publication Data
US 2018/0376610 A1  Dec. 27, 2018

(30) Foreign Application Priority Data
Jun. 27, 2017  (JP) ................. 2017-124760

(51) Int. Cl.
*H05K 7/10* (2006.01)
*H01R 13/187* (2006.01)
(Continued)

(52) U.S. Cl.
CPC ......... *H05K 7/1069* (2013.01); *G01R 1/0466* (2013.01); *H01R 12/7082* (2013.01);
(Continued)

(58) Field of Classification Search
CPC ....... H01R 12/52; H01R 9/096; H05K 7/1069
(Continued)

(56) References Cited

U.S. PATENT DOCUMENTS 5,308,252 A * 5/1994 Mroczkowski .... H01R 13/2435
  439/591
5,415,559 A * 5/1995 Ichimura ............ H01R 13/2435
  439/140
(Continued)

FOREIGN PATENT DOCUMENTS

JP  2005-174622 A  6/2005
JP  2015-133332 A  7/2015

*Primary Examiner* — Tulsidas C Patel
*Assistant Examiner* — Marcus E Harcum
(74) *Attorney, Agent, or Firm* — Molex, LLC

(57) ABSTRACT

The socket of the present disclosure includes: a terminal unit assembly with a plurality of terminal units, each extending in a longitudinal direction, arranged along a lateral direction orthogonal to the longitudinal direction; and a frame member including an assembly accommodating recess that accommodates the terminal unit assembly. The terminal units each include: a terminal holding part extending in the longitudinal direction; a plurality of terminals; and a side wall. The plurality of terminals each includes a body held by the terminal holding part, a contact part protruding upward beyond an upper surface the terminal unit or protruding downward beyond a lower surface of the terminal unit, and a contact arm connecting the body and the contact part; and the side wall extends in the longitudinal direction, includes a plurality of abutting parts capable of abutting the contact arm, and is arranged adjacent to the terminal holding part in the lateral direction. When the contact part receives force in a vertical direction orthogonal to the lateral direction and the longitudinal direction, the side wall receives force toward one side in the longitudinal direction.

10 Claims, 11 Drawing Sheets

(51) Int. Cl.
  *G01R 1/04*   (2006.01)
  *H01R 12/70*  (2011.01)
  *H01R 13/518* (2006.01)
  *H01R 12/71*  (2011.01)
  *H01R 12/73*  (2011.01)

(52) U.S. Cl.
  CPC ......... *H01R 13/187* (2013.01); *H01R 13/518* (2013.01); *H01R 12/714* (2013.01); *H01R 12/73* (2013.01)

(58) Field of Classification Search
  USPC .......................................... 439/66, 591, 908
  See application file for complete search history.

(56) References Cited

U.S. PATENT DOCUMENTS

| | | | | |
|---|---|---|---|---|
| 5,951,303 A * | 9/1999 | Wilmsmann nee Sudmoller | | H01R 12/52 439/66 |
| 6,709,279 B2 * | 3/2004 | Uratsuji | | G01R 1/0483 439/66 |
| 6,877,992 B2 * | 4/2005 | Grant | | H01R 13/2435 439/591 |
| 7,753,695 B2 * | 7/2010 | Howell | | H01R 13/33 439/66 |
| 7,883,339 B2 * | 2/2011 | Hsu | | H01R 13/514 439/330 |
| 8,087,955 B2 * | 1/2012 | Kazama | | G01R 1/07371 439/607.03 |
| 8,475,179 B2 * | 7/2013 | Lin | | H01R 12/7082 439/66 |
| 2004/0157476 A1 * | 8/2004 | Maldonado | | H01R 13/2435 439/66 |
| 2007/0015376 A1 * | 1/2007 | Szu | | H01R 13/2442 439/66 |
| 2011/0151688 A1 * | 6/2011 | Beaman | | H01R 12/585 439/66 |
| 2014/0162472 A1 * | 6/2014 | Walden | | H01R 12/714 439/66 |

\* cited by examiner

FIG. 6

SOCKET HAVING A TERMINAL UNIT ASSEMBLY ACCOMMODATED WITHIN A RECESS OF A FRAME MEMBER

RELATED APPLICATIONS

This application claims priority to Japanese Application No. 2017-124760, filed Jun. 27, 2017, which is incorporated herein by reference in its entirety.

TECHNICAL FIELD

The preset disclosure relates to a socket.

BACKGROUND ART

Conventionally, a semiconductor device such as an integrated circuit (IC) or a large-scale integrated circuit (LSI) with a terminal of a pin grid array (PGA) type is connected to a circuit board such as a printed circuit board when an IC tester is used for testing. In such a case, the terminal of the semiconductor device is electrically connected to a conductive trace of the circuit board, via of a socket attached to the circuit board (for example, refer to Patent Document 1).

FIG. 11 is a cross-sectional view of main parts of a conventional socket.

In the drawing, 811 denotes a housing of the socket used for connecting the semiconductor device to the circuit board. The housing is a plate shaped member made of an insulating material such as resin, and has a plurality of terminal accommodating chambers 813 formed therein. Adjacent terminal accommodating chambers 813 are partitioned from one another by an inclined wall 814.

Each terminal accommodating chamber 813 accommodates a terminal 861. The terminal 861 includes an arcuate part 863, a first arm 864 extending diagonally upward from the arcuate part 863, and a second arm 862 extending diagonally downward from the arcuate part 863. A first contact part 864a protruding upward beyond an upper surface of the housing 811 is formed at the upper end of the first arm 864. A second contact part 862a protruding downward beyond a lower surface of the housing 811 is formed at the lower end of the second arm 862. The arcuate part 863 is positioned within a step 815 formed in a lower portion of the inclined wall 814.

When the socket is used to connect the semiconductor device to the circuit board, the first contact part 864a is pressed by a terminal exposed on a lower surface of an unillustrated semiconductor device from above, and the second contact part 862a is pressed by a terminal exposed on an upper surface of an unillustrated circuit board from below. When the first contact part 864a is pressed from above, the first arm 864 elastically deforms in a clockwise direction about the arcuate part 863, whereby the first contact part 864a is elastically displaced obliquely downward to the right. When the second contact part 862a is pressed from below, the second arm 862 elastically deforms in a counterclockwise direction about the arcuate part 863, whereby the second contact part 862a is elastically displaced obliquely upward to the right. Thus, the first contact part 864a and the second contact part 862a ensure a contact state to be maintained between the semiconductor device and the terminal of the circuit board.

Patent Document 1: Japanese Patent Publication No. 2015-133332

SUMMARY

When the first contact part 864a and the second contact part 862a of the conventional socket are respectively displaced obliquely downward to the right and the obliquely upward to the right, the arcuate part 863 receives the resultant reaction force, and exhibits force which presses a side wall 816 of the step 815 to the left. As a result, the housing 811 receives a load toward the left side from the terminal 861. The load received from an individual terminal 861 could be small, but the total load received from all the terminals 861 will be considerably large when the number of terminals 861 is large. Thus, an unillustrated holding member holding the housing 811 may be deformed or damaged, or even the housing 811 itself might be deformed or damaged.

Therefore, an object of the present disclosure is to provide a highly durable socket that solves the conventional problem, features a simple structure, and is low in cost with no large accumulated force from the terminals.

To achieve the object, the socket of the present disclosure includes a terminal unit assembly with a plurality of terminal units, each extending in a longitudinal direction, arranged along a lateral direction orthogonal to the longitudinal direction, and a frame member including an assembly accommodating recess that accommodates the terminal unit assembly. The terminal units each include a terminal holding part extending in the longitudinal direction, a plurality of terminals, and a side wall extending in the longitudinal direction, the plurality of terminals each including a body held by the terminal holding part, a contact part protruding upward beyond an upper surface the terminal unit or protruding downward beyond a lower surface of the terminal unit, and a contact arm connecting the body and the contact part with each other, and the side wall including a plurality of abutting parts capable of abutting the contact arm, and being arranged adjacent to the terminal holding part in the lateral direction. When the contact part receives force in a vertical direction orthogonal to the lateral direction and the longitudinal direction, the side wall receives force toward one side in the longitudinal direction.

With another socket, in a pair of terminal units adjacently arranged in the lateral direction, when the side wall of a first terminal unit receives force toward one side in the longitudinal direction, the side wall of a second terminal unit receives force toward the other side in the longitudinal direction.

With another socket, in a pair of terminal units adjacently arranged in the lateral direction, when the terminal holding part of a first terminal unit receives force toward the other side in the longitudinal direction, the terminal holding part of a second terminal unit receives the force toward the one side in the longitudinal direction.

With another socket, engagement parts to be engaged with the frame member are formed on both ends of the terminal holding part, abutting surfaces which abut the frame member are formed on both ends of the side wall, and the frame member receives the force in the longitudinal direction received by the terminal holding part and the force in the longitudinal direction received by the side wall.

With yet another socket, the frame member includes an upper frame member and a lower frame member, the lower frame member receives the force in the longitudinal direction received by the terminal holding part, and the upper frame member receives the force in the longitudinal direction received by the side wall.

With yet another socket, the contact arm includes an inner arm diagonally extending from the body toward the one side in the longitudinal direction, a curved part connected to a distal end of the inner arm, and an outer arm diagonally extending toward the other side in the longitudinal direction from the curved part to the contact part, and the curved part abuts a corresponding abutting part when the contact part receives force in the vertical direction orthogonal to the lateral direction and the longitudinal direction.

With yet another socket, an arm curved space part having a circumference defined by the inner arm, the curved part, and the outer arm is formed on a side of each of the curved parts opposite the corresponding abutting part, and the arm curved space part accommodates the abutting part corresponding to the curved part of the contact arm adjacent to the other side in the longitudinal direction.

The socket according to the present disclosure receives no large accumulated force from the terminal. Thus, a socket featuring a simplified structure, a lower cost, and higher durability can be achieved.

BRIEF DESCRIPTION OF THE DRAWINGS

FIG. 6 is a side view of the first terminal unit in accordance with the present embodiment.

DETAILED DESCRIPTION OF THE PREFERRED EMBODIMENTS

An embodiment will be described in detail below with reference to the drawings.

Figure 1:
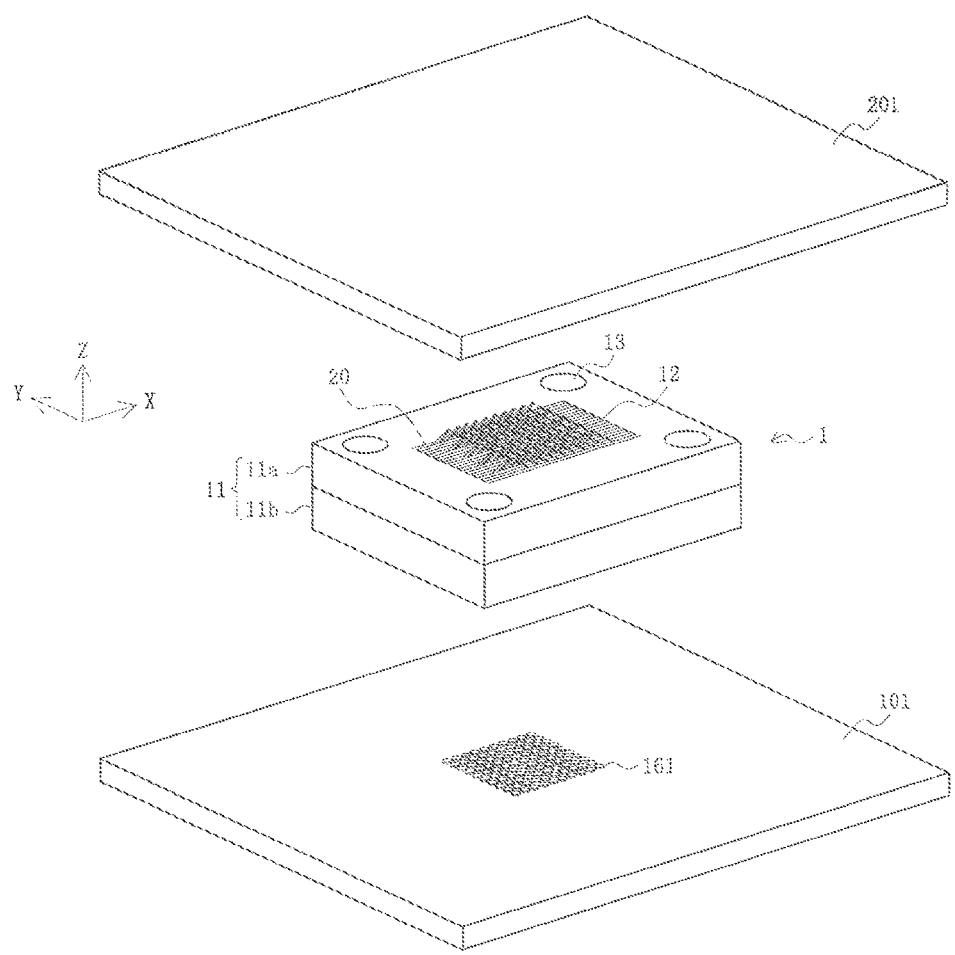
FIG. 1 is an exploded assembly diagram illustrating a socket and a connection target device according to an embodiment.
Figure 2:
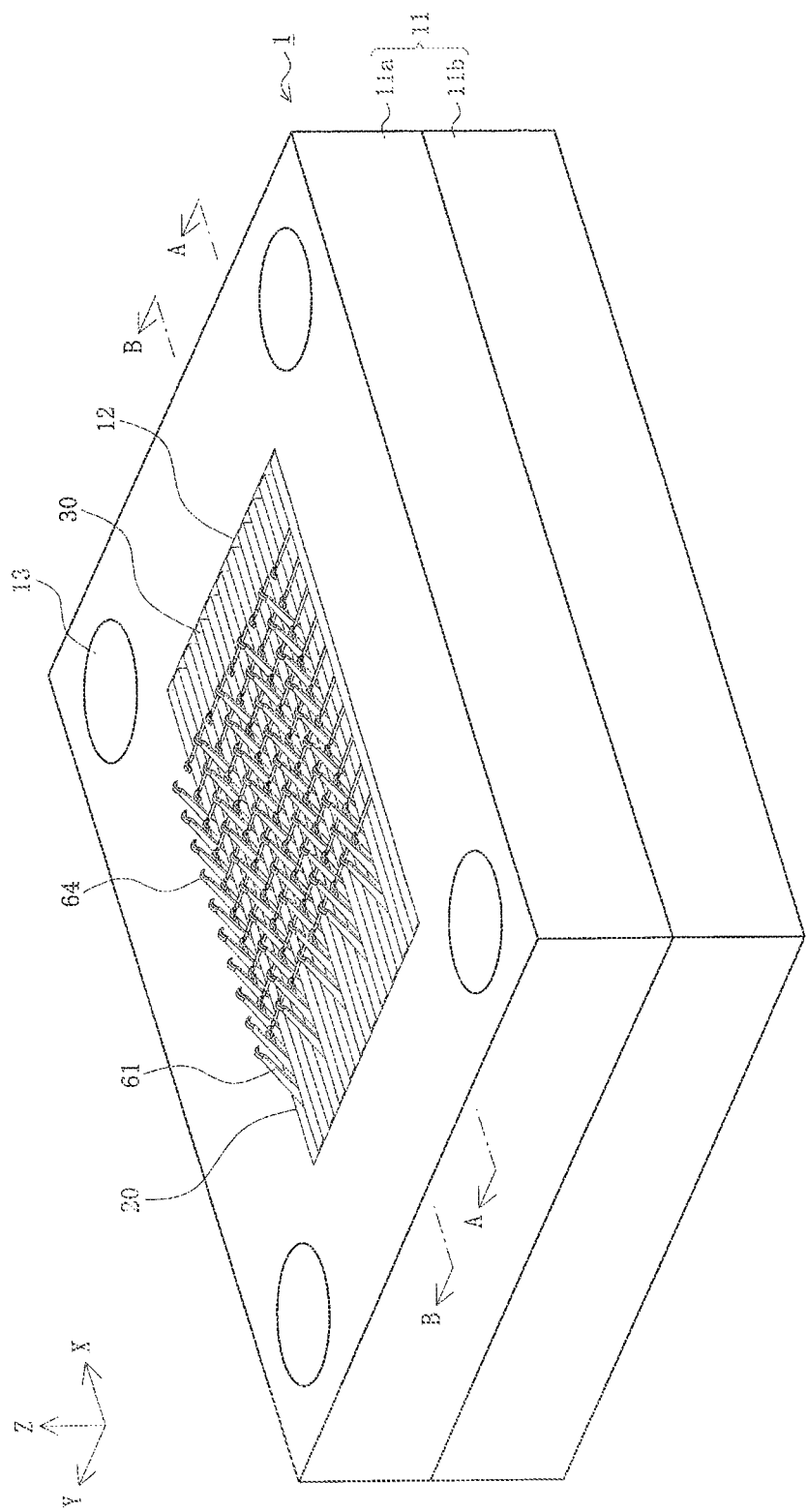
FIG. 2 is a perspective view illustrating an initial state of the socket according to the present embodiment.

FIG. 1 is an exploded assembly diagram illustrating a socket and a connection target device according to the present embodiment, and FIG. 2 is a perspective view illustrating an initial state of the socket according to the present embodiment.

In the drawings, 1 denotes a socket according to the present embodiment including: a terminal unit assembly 20 in which a plurality of terminal units 30 each including a plurality of terminals 61 are assembled; and a frame member 11 that holds the terminal unit assembly 20. In the illustrated example, the terminal unit assembly 20 includes twenty terminal units 30 each including ten terminals 61. Note that the number of terminal units 30 in the terminal unit assembly 20 and the number of terminals 61 in each of the terminal units 30 can be changed as appropriate.

The frame member 11 is a plate-shaped member with a substantially rectangular outer shape in a plan view, that is, on an X-Y plane, and defines the circumference of an assembly accommodating recess 12 with a substantially rectangular shape on the X-Y plane. The frame member 11 includes an upper frame member 11a and a lower frame member 11b integrally formed of an insulating material such as synthetic resin. In a state where the terminal unit assembly 20 is accommodated in the assembly accommodating recess 12, the socket 1 has a thick plate-like outer shape that is substantially rectangular on the X-Y plane, and has an upper surface (Z-axis positive direction surface) and a lower surface (Z-axis negative direction surface) that are flat-parallel surfaces.

In an initial state of the socket 1, that is, in a state where the socket 1 is not used for establishing connection between a first connection target device 101 and a second connection target device 201 and thus no external force is applied to the terminals 61 and the like, the socket 1 has contact parts 64 of the terminals 61 protruding beyond the upper and the lower surfaces of the socket 1. The socket 1 has a lower surface pressed by an upper surface of the first connection target device 101 provided below (Z-axis negative direction) the socket 1 and has an upper surface pressed by a lower surface of the second connection target device 201 provided above (Z-axis positive direction) the socket 1. As a result, the contact parts 64 are brought into contact with mating terminals 161 provided on the upper surface of the first connection target device 101 and with unillustrated mating terminals arranged on the lower surface of the second connection target device 201. The socket 1 has the upper surface provided with guide holes 13 into which unillustrated guide members, having a column shape, are inserted for positioning between the first connection target device 101 and the second connection target device 201.

For example, one of the first connection target device 101 and the second connection target device 201 is a semiconductor device such as an IC or an LSI, and the other one of the devices is an inspection circuit board for a semiconductor inspection device. Note that any type of electrical device or electronic device or its circuit board may be used as long as a flat terminal that can come into contact with and be in conduction with the contact part 64 is provided on at least one surface. An example of the devices includes a printed circuit board such as a motherboard or a daughter board in an electronic device such as a personal computer, a television receiver, a game device, a camera, or a navigation device.

Note that in the present embodiment, expressions indicating directions such as up, down, left, right, front, and back that are used to describe the configuration and operation of each part included in the socket 1 and other members are relative and not absolute, and they are suitable when each part included in the socket 1 and the other members are in the positions illustrated by the drawings; however, when the position of each part included in the socket 1 and the other members are changed, then each part should be interpreted with changes corresponding to the changes of the positions.

Next, a configuration of the terminal unit assembly 20 will be described in detail.

Figure 3:
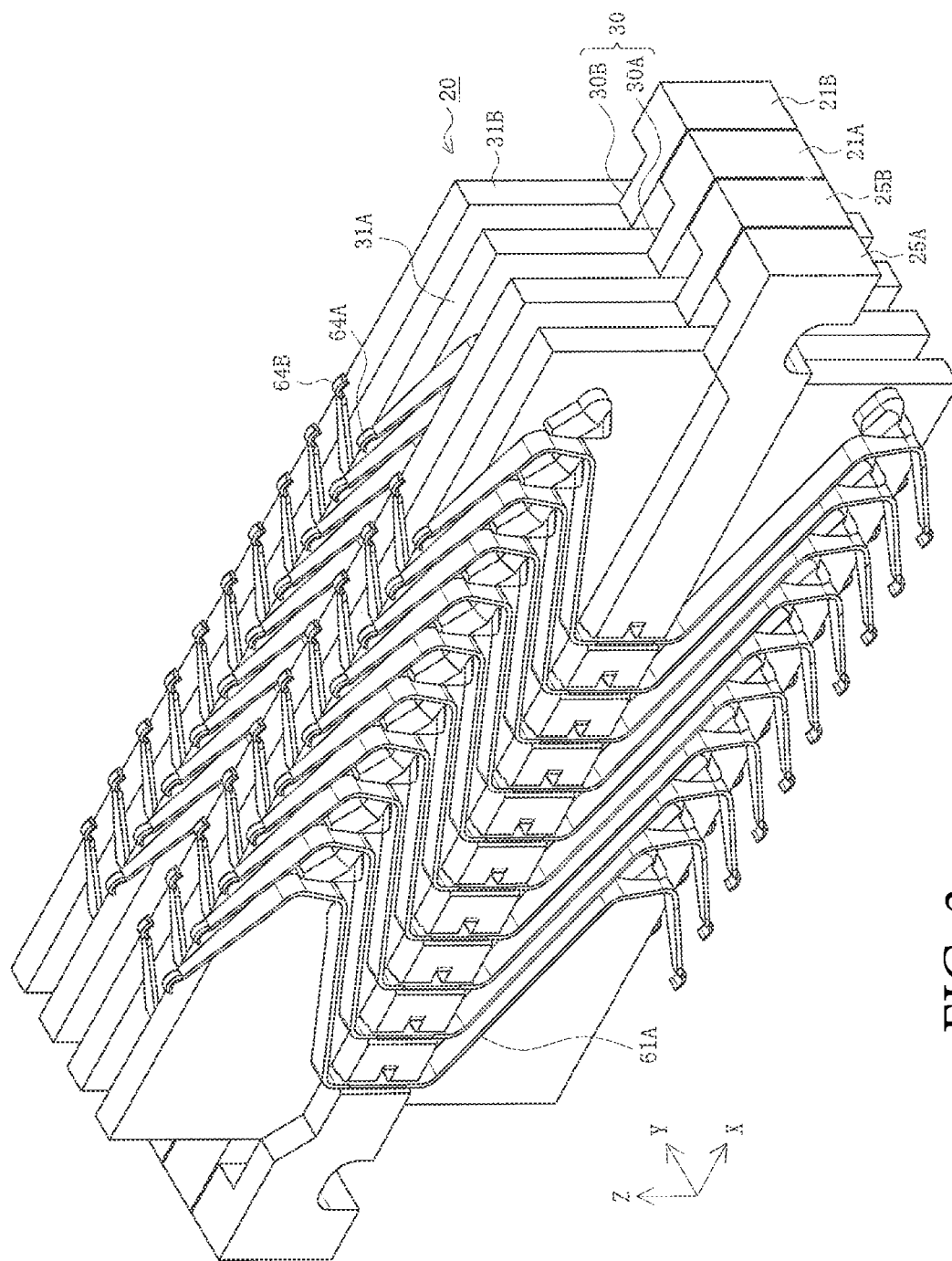
FIG. 3 is a perspective view of a terminal unit assembly in accordance with the present embodiment.
Figure 4:
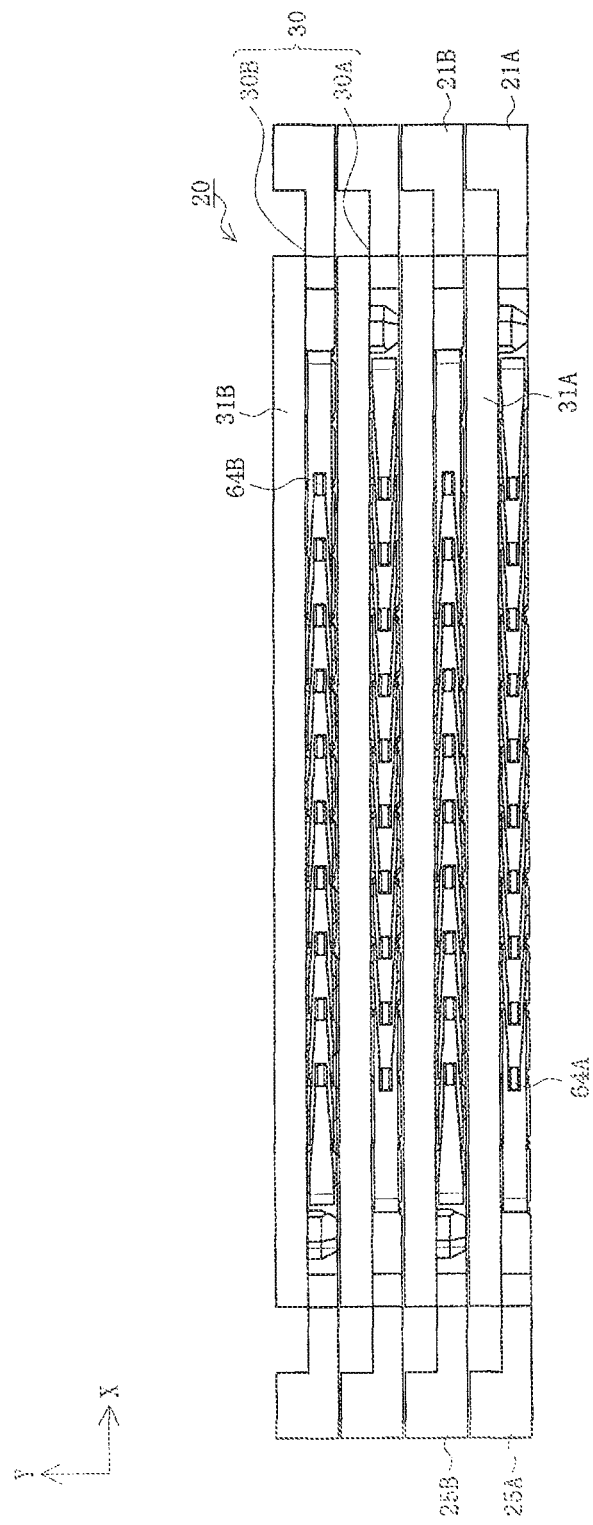
FIG. 4 is a top view of the terminal unit assembly in accordance with the present embodiment.
Figure 5:
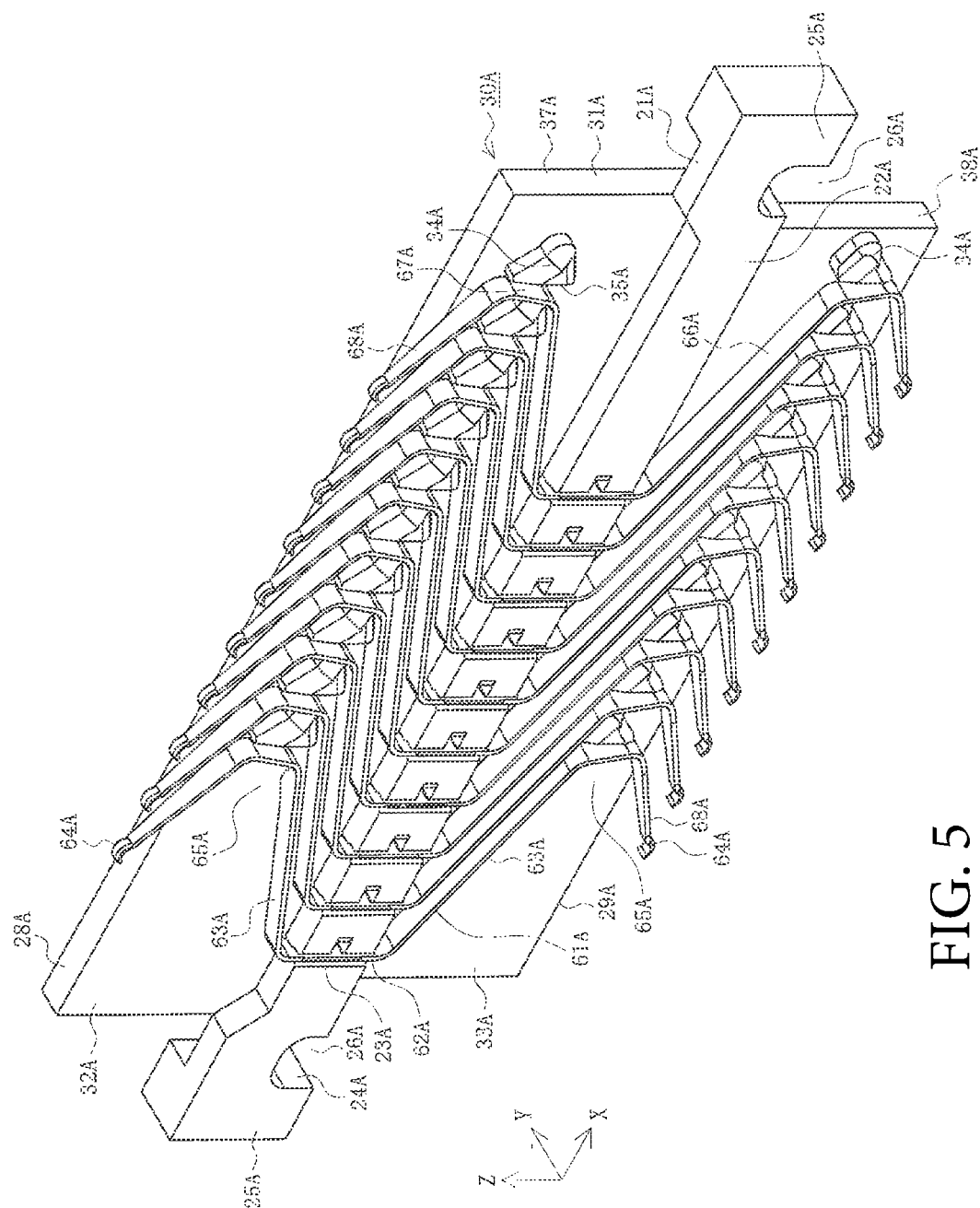
FIG. 5 is a perspective view of a first terminal unit in accordance with the present embodiment.
Figure 6:
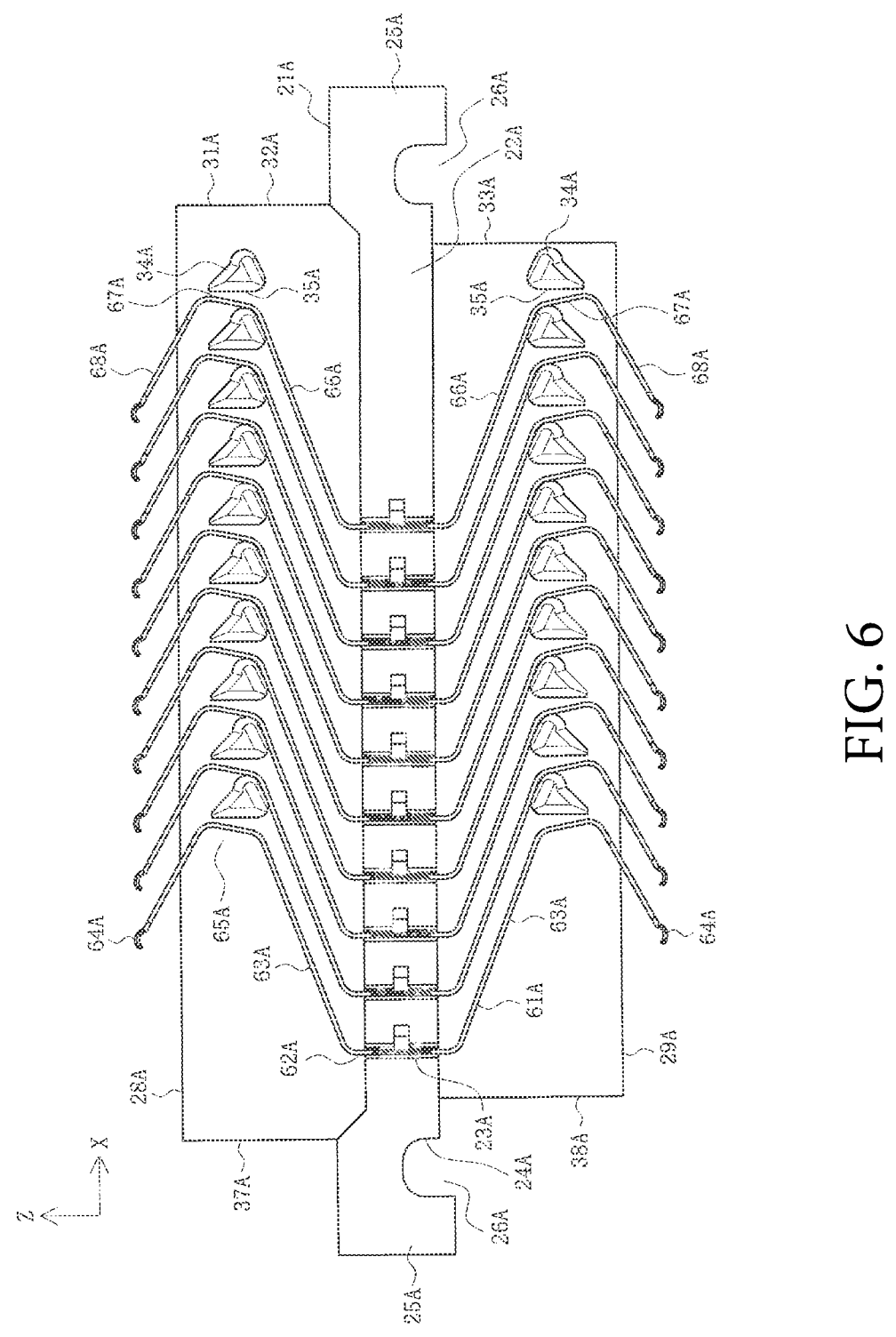
Figure 7:
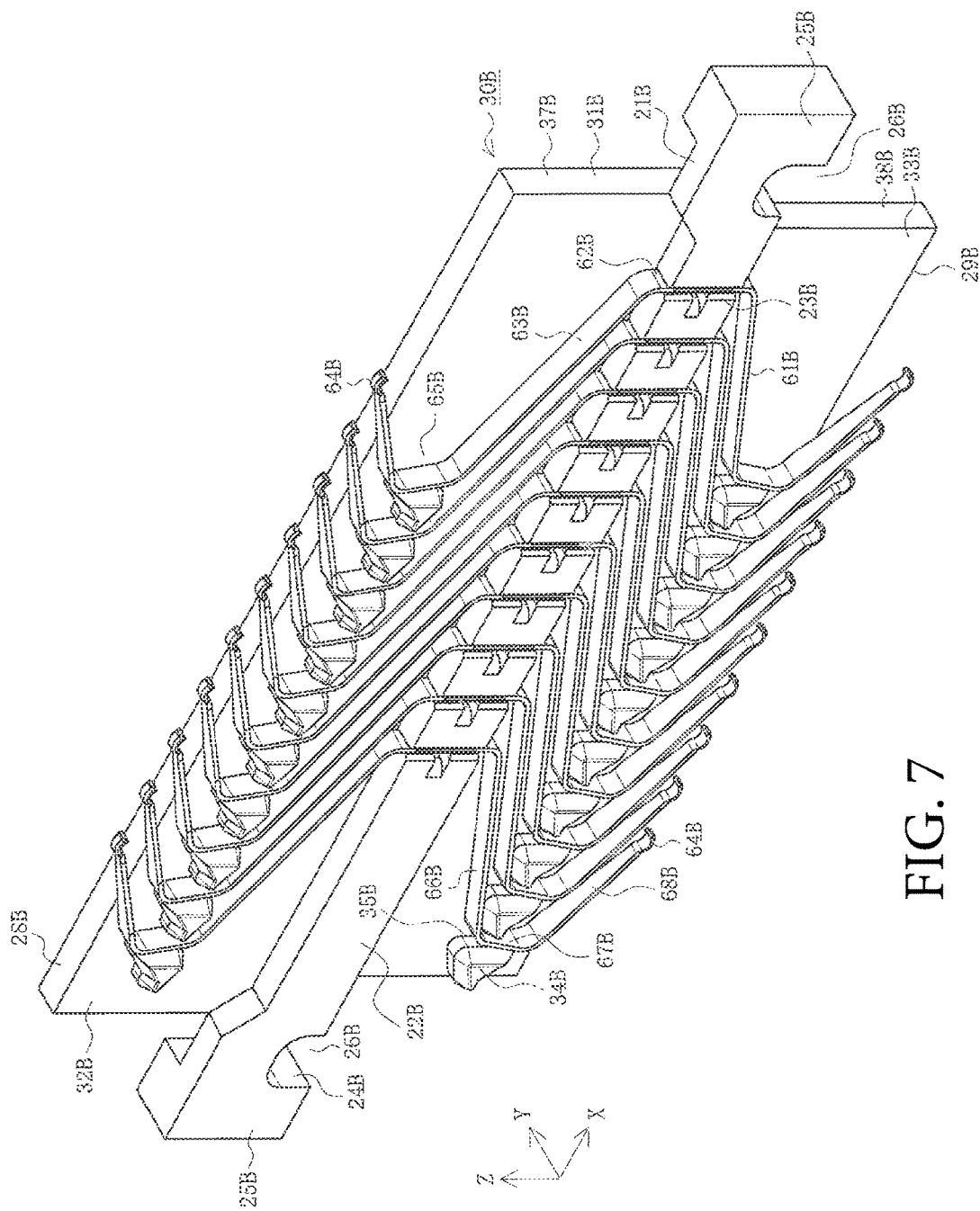
FIG. 7 is a perspective view of a second terminal unit in accordance with the present embodiment.
Figure 8:
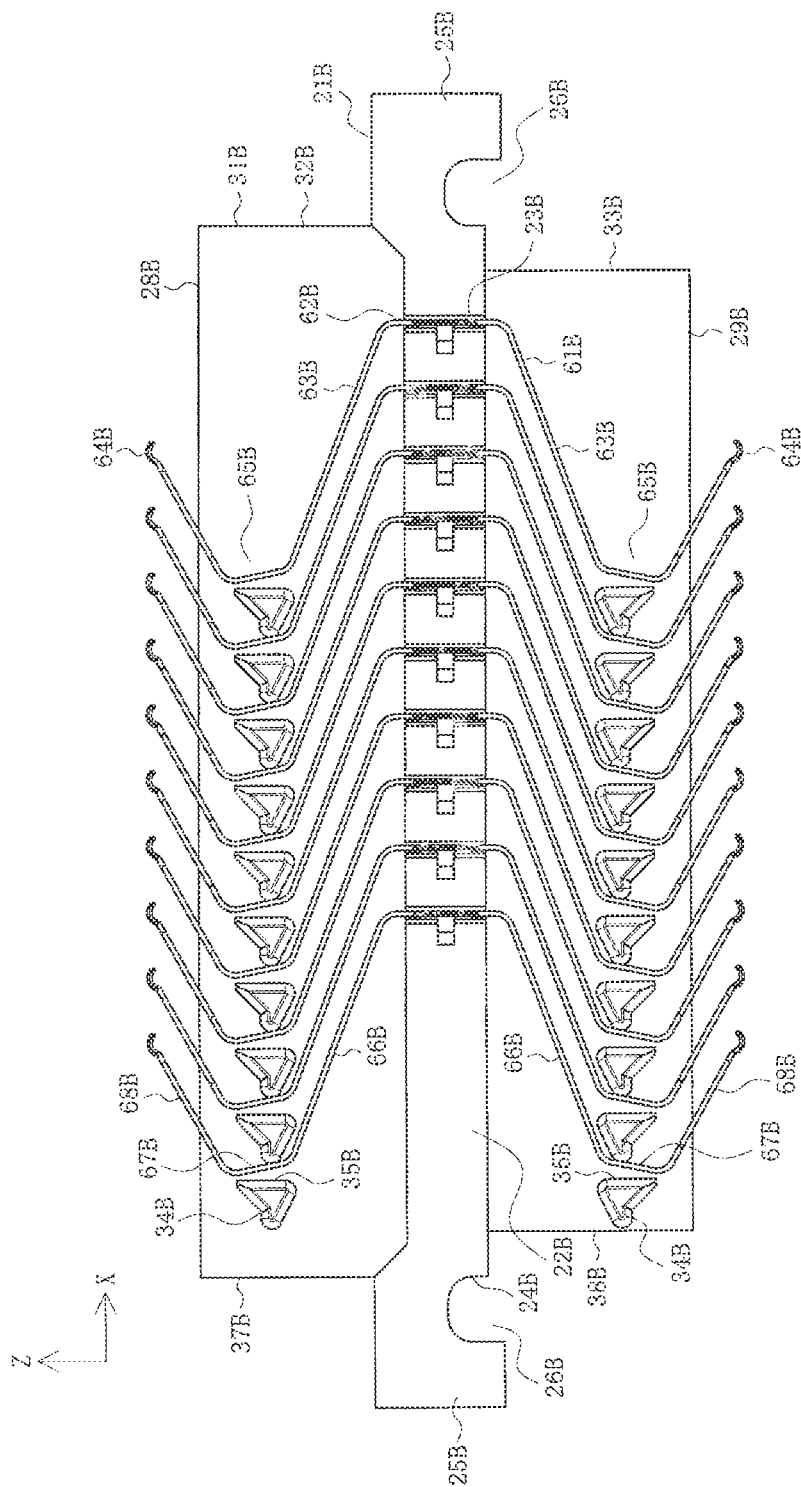
FIG. 8 is a side view of the second terminal unit in accordance with the present embodiment.

FIG. 3 is a perspective view of a terminal unit assembly in accordance with the present embodiment, FIG. 4 is a top view of the terminal unit assembly in accordance with the present embodiment, FIG. 5 is a perspective view of a first terminal unit in accordance with the present embodiment, FIG. 6 is a side view of the first terminal unit in accordance with the present embodiment, FIG. 7 is a perspective view of a second terminal unit in accordance with the present embodiment, and FIG. 8 is a side view of the second terminal unit in accordance with the present embodiment.

In the present embodiment, the terminal unit 30 extending in the longitudinal direction (X axis direction) includes a first terminal unit 30A and a second terminal unit 30B. In the terminal unit assembly 20, the first and the second terminal units 30A and 30B are alternately arranged in a lateral direction (Y axis direction). Note that the terminal unit assembly 20 illustrated in FIGS. 1 and 2 is only partially illustrated in FIGS. 3 and 4 for the convenience of illustration.

As illustrated in FIGS. 5 and 6, the first terminal unit 30A includes a first terminal holding part 21A that is integrally formed of an insulating material such as synthetic resin and extends in the longitudinal direction, a first side wall 31A that is integrally formed of an insulating material such as synthetic resin and extends in the longitudinal direction, and a conductive metal plate with a spring property. The first terminal unit 30A includes a plurality of (ten in the illustrated example) first terminals 61A held by the first terminal holding part 21A. The first terminal holding part 21A and the first side wall 31A are arranged to be adjacent to each other in the Y axis direction.

The first terminal holding part 21A includes a first beam 22A with an elongated shape extending in the longitudinal direction and first engagement parts 25A connected to both ends of the first beam 22A in the lengthwise direction. The first engagement part 25A is engaged with the lower frame member 11b, and has a lower surface (Z-axis negative direction surface) provided with a first engagement recess 26A having a first inner surface 24A. Preferably, a dimension in the lateral direction (Y axis direction) that is, the thickness of an end of the first engagement part 25A, is set to be substantially identical with a sum of the thickness of the first beam 22A and the thickness of the first side wall 31A. The first beam 22A has a plurality of (ten in the illustrated example) first terminal holding grooves 23A, each extending in a vertical direction (Z axis direction) and having an elongated slit shape, formed at an interval of approximately 0.8 mm, for example.

The first side wall 31A is a substantially rectangular plate member extending on an X-Z plane, and includes a first upper wall 32A basically positioned above the first beam 22A and a first lower wall 33A basically positioned below the first beam 22A. A plurality of first abutting parts 34A that receive a reaction force from the first terminals 61A are formed at an interval of approximately 0.8 mm, for example, on a side surface of each of the first upper wall 32A and the first lower wall 33A, on the side of the first terminal holding part 21A (Y axis negative direction side). The first abutting parts 34A are protruding members that are integrally formed with and protrude from the side surfaces of the first upper wall 32A and the first lower wall 33A, and each have a surface on a back side (X-axis negative direction side) serving as a first abutting surface 35A that abuts the first terminal 61A. The first abutting parts 34A may be formed on any one of the first upper wall 32A and the first lower wall 33A. However, only an example where the first abutting parts 34A are formed on both of the first upper wall 32A and the first lower wall 33A will be described herein.

The first upper wall 32A and the first lower wall 33A have the same dimensions and shape except that the first upper wall 32A has a larger dimension in the longitudinal direction (X axis direction) than the first lower wall 33A, specifically, the distance between the front and back first upper vertical surfaces 37A serving as abutting surfaces is longer than the distance between the first lower vertical surfaces 38A. The first abutting parts 34A are arranged on the first upper wall 32A and the first lower wall 33A to be symmetrical, in the vertical direction, about a symmetric axis extending in the front and back direction while passing through the center of the first side wall 31A in the vertical direction.

The first terminal 61A is a plate member that has an elongated strip shape as a whole formed by performing processes such as punching or bending on a metal plate, and includes a first body 62A that is held by the first terminal holding groove 23A and extends in the vertical direction, a pair of first contact arms 63A connected to both ends of the first body 62A, and first contact parts 64A that are each curved and formed on a distal end of a corresponding one of the first contact arms 63A. The first contact arms 63A each include a first inner arm 66A diagonally extending toward the front side from the first body 62A, a first curved part 67A connected to a distal end of the first inner arm 66A, and a first outer arm 68A that extends diagonally toward the back side from the first curved part 67A and has a free end provided with the first contact part 64A. More specifically, the first curved part 67A has a linear part and curved parts connected to both ends of the linear part, and the linear part abuts the first abutting part 34A. The first terminal 61A has a substantially W shape on an X-Z plane that is symmetrical in the vertical direction about the symmetric axis extending in the front and back direction while passing through the center of the first side wall 31A in the vertical direction.

As shown in FIG. 6, the plurality of first terminals 61A are arranged along the front-back direction, with the first bodies 62A, the first inner arms 66A, the first curved parts 67A, and the first outer arms 68A of adjacent first terminals 61A extending in parallel with each other with a gap in between. In the initial state with no external force on the first terminal 61A, the first curved part 67A of each of the first terminals 61A is not abutting the first abutting surface 35A of the corresponding first abutting part 34A (the first abutting part 34A positioned on the front side (X-axis positive direction side) of the first curved part 67A). A first arm curved space part 65A defined by the first inner arm 66A, the first curved part 67A, and the first outer arm 68A is formed on the back side of the first curved part 67A of each of the first terminals 61A. The first arm curved space part 65A accommodates the first abutting part 34A corresponding to the first curved part 67A of the first terminal 61A adjacent to the back side of the first terminal 61A. In the initial state, each of the first contact parts 64A and a part of each of the first outer arms 68A protrude upward or downward beyond the first upper surface 28A of the first upper wall 32A that is the upper surface of the first terminal unit 30A, and the first lower surface 29A of the first lower wall 33A that is the lower surface of the first terminal unit 30A.

As illustrated in FIGS. 7 and 8, the second terminal unit 30B includes: a second terminal holding part 21B that is integrally formed of an insulating material such as synthetic resin and extends in the longitudinal direction; a second side wall 31B that is integrally formed of an insulating material such as synthetic resin and extends in the longitudinal direction; and a plurality (ten in the illustrated example) of second terminals 61B that are made of a conductive metal plate having a spring property and are held by the second terminal holding part 21B. The second terminal holding part 21B and the second side wall 31B are arranged to be adjacent to each other in the Y axis direction.

The second terminal holding part 21B includes a second beam 22B with an elongated shape extending in the longitudinal direction and second engagement parts 25B connected to both ends of the second beam 22B in the lengthwise direction. The second engagement part 25B is engaged with the lower frame member 11b, and has a lower surface (Z-axis negative direction surface) provided with a second engagement recess 26B having a second inner surface 24B. Preferably, a dimension in the lateral direction (Y axis direction), that is, the thickness of an end of the second engagement part 25B is set to be substantially identical to a sum of the thickness of the second beam 22B and the thickness of the second side wall 31B. The second beam 22B has a plurality of (ten in the illustrated example) second terminal holding grooves 23B, each extending in a vertical direction (Z axis direction) and having an elongated slit shape, formed at an interval of approximately 0.8 mm, for example.

The second side wall 31B is a substantially rectangular plate member extending on the X-Z plane, and includes a second upper wall 32B basically positioned above the second beam 22B and a second lower wall 33B basically positioned below the second beam 22B. A plurality of (ten in the illustrated example) second abutting parts 34B that receive reaction force from the second terminals 61B are formed at an interval of approximately 0.8 mm, for example, on a side surface of each of the second upper wall 32B and the second lower wall 33B on the side of the second terminal holding part 21B (Y axis negative direction side). The second abutting parts 34B are protruding members that are integrally formed with and protrude from the side surfaces of the second upper wall 32B and the second lower wall 33B, and each have a surface on the front side (X-axis positive direction side) serving as a second abutting surface 35B that comes into contact with the second terminal 61B. The second abutting parts 34B may be formed on any one of the second upper wall 32B and the second lower wall 33B. However, only an example where the second abutting parts 34B are formed on both of the second upper wall 32B and the second lower wall 33B will be described herein.

The second upper wall 32B and the second lower wall 33B have the same dimensions and shape except that the second upper wall 32B has a larger dimension in the longitudinal direction (X axis direction) than that of the second lower wall 33B, specifically, the distance between the front and back second upper vertical surfaces 37B serving as abutting surfaces is longer than the distance between the second lower vertical surfaces 38B. The second abutting parts 34B are arranged on the second upper wall 32B and the second lower wall 33B to be symmetrical, in the vertical direction, about a symmetric axis extending in the front and back direction while passing through the center of the second side wall 31B in the vertical direction.

The second terminal 61B is a plate member that has an elongated strip shape as a whole formed by performing processes such as punching or bending on a metal plate, and includes a second body 62B that is held by the second terminal holding groove 23B and extends in the vertical direction, a pair of second contact arms 63B connected to both ends of the second body 62B, and second contact parts 64B that are each curved and formed on a distal end of a corresponding second contact arms 63B. The second contact arms 63B each include a second inner arm 66B diagonally extending toward the back side from the second body 62B, a second curved part 67B connected to a distal end of the second inner arm 66B, and a second outer arm 68B that extends diagonally toward the back side from the second curved part 67B and has a free end provided with the second contact part 64B. More specifically, the second curved part 67B has a linear part and curved parts connected to both ends of the linear part, and the linear part abuts the second abutting part 34B. The second terminal 61B has a substantially W shape on the X-Z plane that is symmetrical in the vertical direction about the symmetric axis extending in the front and back direction while passing through the center of the second side wall 31B in the vertical direction.

As illustrated in FIG. 8, the plurality of second terminals 61B are arranged along the front-back direction, with the second bodies 62B, the second inner arms 66B, the second curved parts 67B, and the second outer arms 68B of adjacent second terminals 61B extending in parallel with each other with a gap in between. In the initial state with no external force on the second terminal 61B, the second curved part 67B of each of the second terminals 61B does not abut the second abutting surface 35B of the corresponding second abutting part 34B (the second abutting part 34B positioned on the back side (X-axis negative direction side) of the second curved part 67B). A second arm curved space part 65B defined by the second inner arm 66B, the second curved part 67B, and the second outer arm 68B is formed on the front side of the second curved part 67B of each of the second terminals 61B. The second arm curved space part 65B accommodates the second abutting part 34B corresponding to the second curved part 67B of the second terminal 61B adjacent to the front side of the second terminal 61B. In the initial state, each of the second contact parts 64B and a part of each of the second outer arms 68B protrude upward or downward beyond the second upper surface 28B of the second upper wall 32B that is the upper surface of the second terminal unit 30B and the second lower surface 29B of the second lower wall 33B that is the lower surface of the second terminal unit 30B.

The first terminal unit 30A and the second terminal unit 30B as well as each component of the first terminal unit 30A and its counterpart in the second terminal unit 30B may be mentioned below without distinction. In such a case, the terms "first" and "second" as well as reference signs "A" and "B" are omitted.

Next, the operation of each component when the socket 1 of the abovementioned configuration is used to connect the first connection target device 101 and the second connection target device 201 will be described.

Figure 9:
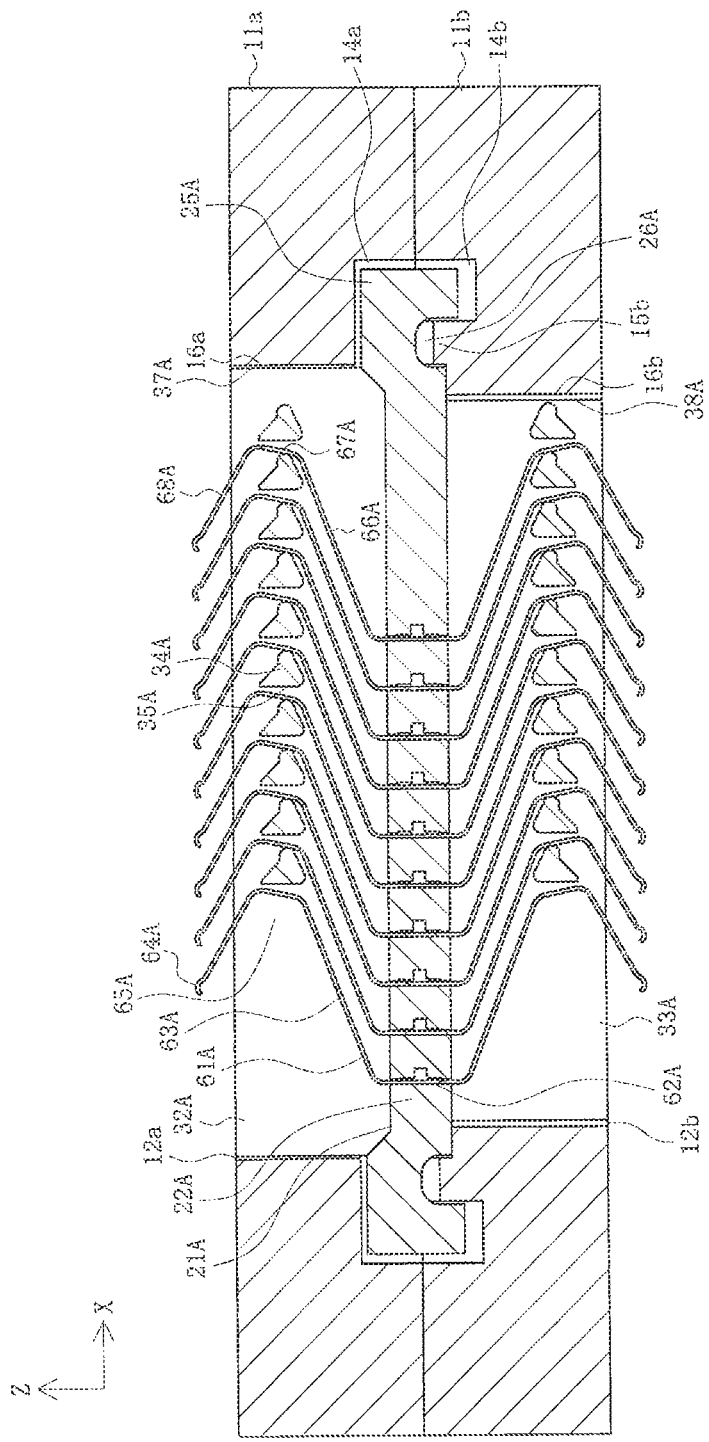
FIG. 9 is a cross-sectional view for illustrating an operation of the first terminal unit of the socket according to the present embodiment, cut along line A-A in FIG. 2.
Figure 10:
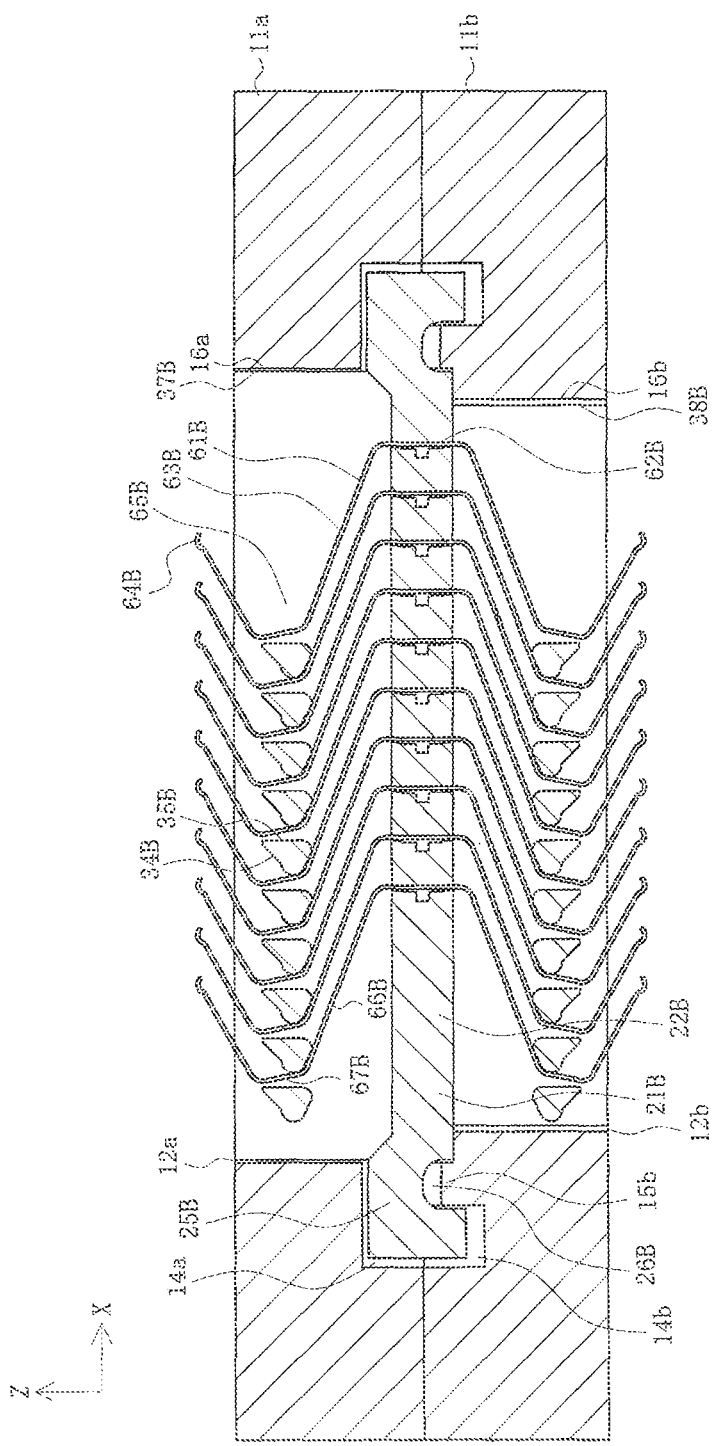
FIG. 10 is a cross-sectional view for illustrating an operation of the second terminal unit of the socket according to the present embodiment, cut along line B-B in FIG. 2.
Figure 11:
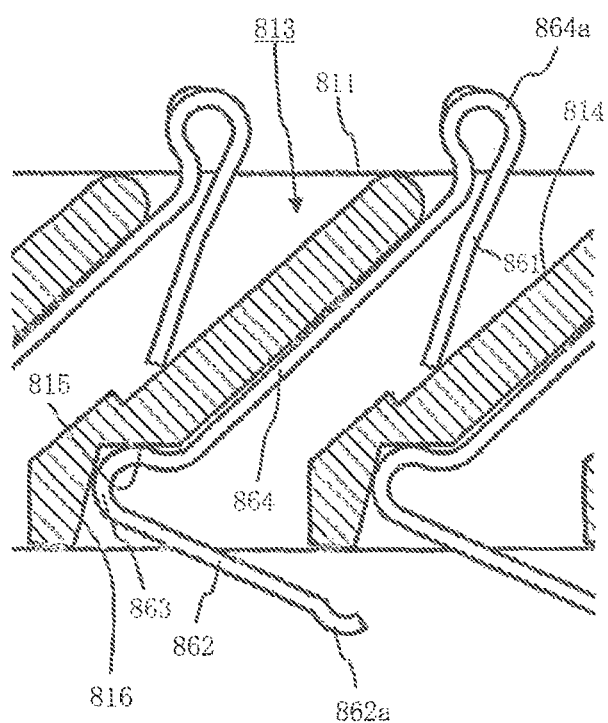
FIG. 11 is a cross-sectional view of the main parts of a conventional socket.

FIG. 9 is a cross-sectional view for illustrating an operation of the first terminal unit in the socket according to the present embodiment, cut along line A-A in FIG. 2, and FIG. 10 is a cross-sectional view for illustrating an operation of the second terminal unit in the socket according to the present embodiment, cut along line B-B in FIG. 2.

In a state where the terminal unit assembly 20 is accommodated in the assembly accommodating recess 12, the engagement part 25 of the terminal holding part 21 of the terminal unit 30 has entered the upper engagement recess 14a formed on the upper frame member 11a and the lower engagement recess 14b formed on the lower frame member 11b, and the engagement recess 26 formed on the lower surface of the engagement part 25 is engaged with the lower protrusion 15b formed on the lower surface of the lower frame member 11b. More specifically, the first inner surface 24A formed on the inner side of the first engagement recess 26A abuts the inner surface of the engagement protrusion 15b in the first terminal unit 30A. The second inner surface 24B formed on the inner side of the second engagement recess 26B abuts the inner surface of the engagement protrusion 15b in the second terminal unit 30B. Thus, excessive displacement between the first terminal unit 30A and the second terminal unit 30B can be prevented, and the terminal holding part 21 is engaged with and held by the frame member 11. Thus, the terminal holding part 21 is positioned with respect to the lower frame member 11*b* in the front-back direction, but can be displaced with respect to the upper frame member 11*a* in the front-back direction.

In the assembly accommodating recess 12, a dimension in the longitudinal direction (X axis direction) of the upper assembly accommodating recess 12*a*, which is formed in the upper frame member 11*a*, is larger than a dimension in the longitudinal direction of the lower assembly accommodating recess 12*b*, which is formed in the lower frame member 11*b*, that is, the distance between the front and back upper vertical wall surfaces 16*a* is longer than the distance between the lower vertical wall surfaces 16*b*. The distance between the upper vertical wall surfaces 16*a* is longer than the distance between the upper vertical surfaces 37 of the side wall 31, and the distance between the lower vertical wall surfaces 16*b* is longer than the distance between the lower vertical surfaces 38 of the side wall 31 but is shorter than the distance between the upper vertical surfaces 37. Thus, in the state where the terminal unit assembly 20 is accommodated in the assembly accommodating recess 12, the upper wall 32 of the side wall 31 of the terminal unit 30 in accommodated within the upper assembly accommodating recess 12*a*, the lower wall 33 is accommodated in the lower assembly accommodating recess 12*b*, and at least a part of the lower surface of the upper wall 32 is supported by at least a part of the upper surface of the lower frame member 11*b*. Thus, the side wall 31 is engaged with and held by the frame member 11. As illustrated in FIGS. 9 and 10, the upper vertical surface 37 and the upper vertical wall surface 16*a* facing each other are separated from each other by a gap smaller than that between the lower vertical surface 38 and the lower vertical wall surface 16*b* facing each other. Thus, the positioning of the side wall 31 with respect to the frame member 11 in the front-back direction is mainly implemented by the upper wall 32 and the upper frame member 11*a*, and the lower wall 33 can be displaced with respect to the lower frame member 11*b* in the front-back direction.

When the socket 1 is used to connect the first connection target device 101 and the second connection target device 201, the lower surface is pressed by the upper surface of the first connection target device 101 arranged below the socket 1, and the upper surface is pressed by the lower surface of the second connection target device 201 arranged above the socket 1. Thus, the contact part 64 protruding downward beyond the lower surface of the socket 1 contacts the mating terminal 161 provided on the upper surface of the first connection target device 101, is pressed upward by the mating terminal 161, and thus is displaced upward. Similarly, the contact part 64 protruding upward beyond the upper surface of the socket 1 contacts an unillustrated mating terminal provided on the lower surface of the second connection target device 201, is pressed downward by the mating terminal, and is thus displaced downward.

When the upward protruding first contact part 64A of the first terminal 61A in the first terminal unit 30A illustrated in FIG. 9 is pressed downward and is thereby displaced downward, the first curved part 67A is displaced toward the front side and abuts the first abutting surface 35A of the corresponding first abutting part 34A. As a result, the displacement of the first curved part 67A toward the front side stops. Then, when the first contact part 64A is further pressed downward and is thereby displaced downward, the first outer arm 68A rotates in the counterclockwise direction about the first curved part 67A that has been stopped. Thus, the first contact part 64A is displaced to the back side while also being displaced downward, and therefore slides on the surface of the mating terminal of the second connection target device 201, and exhibits a wiping effect. When the first contact part 64A is pressed upward and is thereby displaced upward, the first curved part 67A is displaced toward the front side and abuts the first abutting surface 35A of the corresponding first abutting part 34A. As a result, the displacement of the first curved part 67A toward the front side stops. Then, when the first contact part 64A is further pressed upward and is thereby displaced upward, the first outer arm 68A rotates in the clockwise direction about the first curved part 67A that has been stopped. Thus, the first contact part 64A is displaced to the back while also being displaced upward, and slides on the surface of the mating terminal of the first connection target device 101, thereby exhibiting a wiping effect.

When the first contact part 64A protruding upward is pressed downward and is thereby displaced downward, the first curved part 67A that is no longer displaced toward the front side receives downward force and is displaced downward. Thus, the first body 62A receives backward force via the first inner arm 66A. Similarly, when the first contact part 64A protruding downward is pressed upward and is thereby displaced upward, the first curved part 67A that is no longer displaced toward the front side receives upward force and is displaced upward. Thus, the first body 62A receives backward force via the first inner arm 66A. Accordingly, the first terminal holding part 21A receiving the backward force from all of the first terminals 61A is not displaced toward the back side with respect to the frame member 11*b* because the first engagement recess 26A of the first engagement part 25A is engaged with the engagement protrusion 15*b* of the lower frame member 11*b*. The backward force is received by the lower frame member 11*b*.

The first abutting part 34A receives the forward force from the first curved part 67A, and thus the first side wall 31A receives the forward force from all of the first curved part 67A, but is not displaced forward with respect to the frame member 11 because the first upper vertical surface 37A serving as the abutting surface of the first upper wall 32A abuts the upper vertical wall surface 16*a* of the upper frame member 11*a*. The forward force is received by the upper frame member 11*a*.

When the upward protruding second contact part 64B of the second terminal 61B in the second terminal unit 30B illustrated in FIG. 10 is pressed downward and is thereby displaced downward, the second curved part 67B is displaced toward the back side and abuts the second abutting surface 35B of the corresponding second abutting part 34B. As a result, the displacement of the second curved part 67B toward the back side stops. Then, when the second contact part 64B is further pressed downward and is thereby displaced downward, the second outer arm 68B rotates in the clockwise direction about the second curved part 67B that has been stopped. Thus, the second contact part 64B being displaced downward is also displaced toward the front side, and slides on the surface of the mating terminal of the second connection target device 201, thereby exhibiting a wiping effect. When the downward protruding second contact part 64B is pressed upward and is thereby displaced upward, the second curved part 67B is displaced toward the back side and abuts the second abutting surface 35B of the corresponding second abutting part 34B. As a result, the displacement of the second curved part 67B toward the back side stops. Then, when the second contact part 64B is further pressed upward and is thereby displaced upward, the second outer arm 68B rotates in the counterclockwise direction about the second curved part 67B that has been stopped.

Thus, the second contact part 64B being displaced upward is also displaced toward the front side, and slides on the surface of the mating terminal 161 of the first connection target device 101, thereby exhibiting a wiping effect.

When the second contact part 64B protruding upward is pressed downward and is thereby displaced downward, the second curved part 67B that is no longer displaced toward the front side receives downward force and is displaced downward. Thus, the second body 62B receives backward force via the second inner arm 66B. Similarly, when the second contact part 64B protruding downward is pressed upward and is thereby displaced upward, the second curved part 67B that is no longer displaced toward the back side receives upward force and is displaced upward. Thus, the second body 62B receives forward force via the second inner arm 66B. Accordingly, the second terminal holding part 21B receiving the forward force from all of the second terminals 61B is not displaced toward the front side with respect to the frame member 11b because the second engagement recess 26B of the second engagement part 25B is engaged with the engagement protrusion 15b of the lower frame member 11b. The forward force is received by the lower frame member 11b.

The second abutting part 34B receives the backward force from the second curved part 67A, and thus the second side wall 31B receives the backward force from all of the second curved parts 67B, but is not displaced forward with respect to the frame member 11 because the second upper vertical surface 37B serving as the abutting surface of the second upper wall 32B comes into contact with the upper vertical wall surface 16a of the upper frame member 11a. The backward force is received by the upper frame member 11a.

In this manner, in the first terminal unit 30A, the first terminal holding part 21A receives backward force from the first terminal 61A, and the backward force is eventually received by the lower frame member 11b, whereas the first side wall 31A receives forward force from the first terminal 61A, and the forward force is eventually received by the upper frame member 11a. In the second terminal unit 30B adjacent to the first terminal unit 30A, the second terminal holding part 21B receives forward force from the second terminal 61B, and the forward force is eventually received by the lower frame member 11b, whereas the second side wall 31B receives backward force from the second terminal 61B, and the backward force is eventually received by the upper frame member 11a. Thus, the lower frame member 11b receives force in the X-axis negative direction and in the X-axis positive direction from the first and the second terminal holding parts 21A and 21B of the first and the second terminal units 30A and 30B alternately arranged in the Y axis direction. The upper frame member 11a receives force in the X-axis positive direction and in the X-axis negative direction from the first and the second side walls 31A and 31B of the first and the second terminal units 30A and 30B alternately arranged in the Y axis direction. Thus, the force received by the components of the upper frame member 11a and the force received by the components of the lower frame member 11b are in opposite directions and thus offset each other. With this configuration, the components of the upper frame member 11a and the components of the lower frame member 11b as well as the components of the frame member 11 as a combination of the upper frame member 11a and the lower frame member 11b receive no large force, and thus are not deformed or damaged.

As described above, the contact arm 63 of the terminal 61 functioning as a spring includes the inner arm 66, the curved part 67, and the outer arm 68, and has a long spring shape with a substantially V shape between the body 62 and the contact part 64. Thus, the contact arm 63 is highly flexible, and can function as a spring with a wide deformation range. Thus, the contact part 64 at the distal end of the contact arm 63 does not lose its spring property and can be flexibly displaced largely in the vertical direction. With the spring reaction force, the contact and conductive state with the surface of the mating terminal can be maintained.

As described above, the socket 1 according to the present embodiment includes the terminal unit assembly 20 with a plurality of terminal units 30, each extending in the longitudinal direction, arranged along the lateral direction orthogonal to the longitudinal direction, and the frame member 11 including the assembly accommodating recess 12 that accommodates the terminal unit assembly 20. The terminal units 30 each include the terminal holding part 21 extending in the longitudinal direction, a plurality of terminals 61, and the side wall 31. The plurality of terminals 61 each include the body 62 held by the terminal holding part 21, the contact part 64 protruding upward beyond the upper surface 28 of the terminal unit 30 or protruding downward beyond the lower surface 29 of the terminal unit 30, and the contact arm 63 connecting the body 62 and the contact part 64 with each other. The side wall 31 extends in the longitudinal direction, includes a plurality of contact parts 34 capable of coming into contact with the contact arms 63, and is arranged adjacent to the terminal holding part 21 in the lateral direction. When the contact part 64 receives the force in the vertical direction orthogonal to the lateral direction and the longitudinal direction, the side wall 31 receives force toward one side in the longitudinal direction, and the terminal holding part 21 receives force toward the other side in the longitudinal direction.

Thus, the forces received by the frame member 11 are in opposite directions, and thus offset each other so as not to be large. With this configuration, the socket 1 featuring a simplified structure, lower cost, and higher durability can be achieved.

In a pair of the terminal units 30 adjacently arranged in the lateral direction, when the first side wall 31A of the first terminal unit 30A receives force toward one side in the longitudinal direction and the first terminal holding part 21A of the first terminal unit 30A receives force toward the other side in the longitudinal direction, the second side wall 31B of the second terminal unit 30B receives the force toward the other side in the longitudinal direction and the second terminal holding part 21B of the second terminal unit 30B receives the force toward the one side in the longitudinal direction. In this manner, the direction of the force received by the side wall 31 and the terminal holding part 21 in the first terminal unit 30A is opposite to that in the second terminal unit 30B. Thus, the components of the frame member 11 receive no large force and thus are not deformed or damaged.

The engagement parts 25 to be engaged with the frame member 11 are formed on both ends of the terminal holding part 21. The upper vertical surfaces 37 abutting the frame member 11 are formed on both ends of the side wall 31. The frame member 1 receives the force in the longitudinal direction received by the terminal holding part 21 and the force in the longitudinal direction received by the side wall 31. This ensures the positioning of the terminal unit 30 with respect to the frame member 11, and ensures the positioning of each terminal 61.

The frame member 11 includes the upper frame member 11a and the lower frame member 11b. The lower frame member 11b receives the force in the longitudinal direction received by the terminal holding part 21, and the upper frame member 11a receives the force in the longitudinal direction received by the side wall 31. Thus, the force received by the components of the upper frame member 11a and the force received by the components of the lower frame member 11b are in opposite directions and thus offset each other.

The contact arm 63 includes: the inner arm 66 diagonally extending from the body 62 toward the one side in the longitudinal direction; the curved part 67 connected to the distal end of the inner arm 66; and the outer arm 68 diagonally extending toward the other side in the longitudinal direction from the curved part 67 to the contact part 64. The curved part 67 abuts a corresponding contact part 34 when the contact part 64 receives the force in the vertical direction orthogonal to the lateral direction and the longitudinal direction. As a result, displacement of the curved part 67 in the longitudinal direction stops, and the contact part 34 receives force in the longitudinal direction.

The arm curved space part 65 having a circumference defined by the inner arm 66, the curved part 67, and the outer arm 68 is formed on a side of each of the curved parts 67 opposite the corresponding contact part 34. The arm curved space part 65 accommodates the contact part 34 corresponding to the curved part 67 of an adjacent contact arm 63 on the other side in the longitudinal direction. With this configuration, a plurality of the contact parts 34 can be arranged at short intervals and formed.

The contact part 64 is also displaced in the longitudinal direction when the curved part 67 comes into contact with the corresponding contact part 34. Thus, the contact part 64 slides on the surface of the mating terminal, and thereby exhibits a wiping effect.

Note that the disclosure of the present specification describes characteristics related to preferred and exemplary embodiments. Various other embodiments, modifications and variations within the scope and spirit of the claims appended hereto could naturally be conceived by persons skilled in the art by summarizing the disclosures of the present specification.

The present disclosure is applicable to sockets.

The invention claimed is:

1. A socket comprising:
a terminal unit assembly with a plurality of terminal units, each extending in a longitudinal direction and arranged along a lateral direction orthogonal to the longitudinal direction; and
a frame member including an assembly accommodating recess that accommodates the terminal unit assembly, wherein the terminal units each include:
a terminal holding part extending in the longitudinal direction;
a plurality of terminals; and
a side wall,
the plurality of terminals each including a body held by the terminal holding part, a contact part protruding upward beyond an upper surface of the terminal unit or protruding downward beyond a lower surface of the terminal unit, and a contact arm connecting the body and the contact part; and the side wall extending in the longitudinal direction, including a plurality of abutting parts capable of abutting the contact arm, and being arranged adjacent to the terminal holding part in the lateral direction, and
when the contact part receives force in a vertical direction orthogonal to the lateral direction and the longitudinal direction, the side wall receives force toward one side in the longitudinal direction,
wherein, the contact arm includes an inner arm diagonally extending from the body toward the one side in the longitudinal direction, a curved part connected to a distal end of the inner arm, and an outer arm diagonally extending toward the other side in the longitudinal direction from the curved part to the contact part, and the curved part abuts a corresponding abutting part when the contact part receives force in the vertical direction orthogonal to the lateral direction and the longitudinal direction.

2. The socket according to claim 1, wherein an arm curved space part having a circumference defined by the inner arm, the curved part, and the outer arm is formed on a side of each of the curved parts opposite the corresponding abutting part, and the arm curved space part accommodates the abutting part corresponding to a curved part of the contact arm adjacent to the other side in the longitudinal direction.

3. A socket comprising:
a terminal unit assembly with a plurality of terminal units, each extending in a longitudinal direction and arranged along a lateral direction orthogonal to the longitudinal direction; and
a frame member including an assembly accommodating recess that accommodates the terminal unit assembly, wherein the terminal units each include:
a terminal holding part extending in the longitudinal direction;
a plurality of terminals; and
a side wall, the side wall having an upper wall and a lower wall, the upper wall being generally positioned above the terminal holding part in a vertical direction orthogonal to the lateral direction and the longitudinal direction, the lower wall being generally positioned below the terminal holding part in the vertical direction, the upper wall having a length in the longitudinal direction which is greater than a length of the lower wall in the longitudinal direction,
the plurality of terminals each including a body held by the terminal holding part, an upper contact part protruding upward beyond an upper surface of the terminal unit, a lower contact part protruding downward beyond a lower surface of the terminal unit, an upper contact arm connecting the body and the upper contact part, and a lower contact arm connecting the body and the lower contact part; each of the upper and lower walls including a plurality of abutting parts which protrude therefrom in the lateral direction, the abutting parts being arranged adjacent to the terminal holding part in the vertical direction, each upper contact arm configured to abut against a respective one of the abutting parts protruding from the upper wall, each lower contact arm configured to abut against a respective one of the abutting parts protruding from the lower wall, and
when the upper and lower contact parts receive force in the vertical direction, the side wall receives force toward one side in the longitudinal direction.

4. The socket according to claim 3, wherein each terminal holding part has a first engagement part at a first longitudinal end thereof, a second engagement part at a second, opposite longitudinal end thereof, and a beam which extends between the first and second engagement parts, the upper wall generally being positioned above the beam, the lower wall generally being positioned below the beam.

5. The socket according to claim 4, wherein each of the first and second engagement parts have a thickness in the lateral direction which is substantially equal to a thickness in the lateral direction of the beam and the side wall.

6. The socket according to claim 4, wherein each of the first and second engagement parts has an engagement recess provided in a lower surface thereof, and wherein the frame member has an upper frame member and a lower frame member, wherein the lower frame member has first and second protrusions extending therefrom, wherein the first protrusion extends into the engagement recess of the first engagement part and wherein the second protrusion extends into the engagement recess of the second engagement part.

7. The socket according to claim 4, wherein each of the first and second engagement parts has a protrusion extending therefrom, and wherein the frame member has an upper frame member and a lower frame member, wherein the lower frame member has first and second engagement recesses provided in an upper surface thereof, wherein the first protrusion extends into the first engagement recess and wherein the second protrusion extends into the second engagement recess.

8. A socket comprising:
a terminal unit assembly with a plurality of terminal units, each extending in a longitudinal direction and arranged along a lateral direction orthogonal to the longitudinal direction; and
a frame member including an assembly accommodating recess that accommodates the terminal unit assembly,
wherein the terminal units each include:
a terminal holding part extending in the longitudinal direction;
a plurality of terminals; and
a side wall, the side wall having an upper wall and a lower wall, the upper wall being generally positioned above the terminal holding part in a vertical direction orthogonal to the lateral direction and the longitudinal direction, the lower wall being generally positioned below the terminal holding part in the vertical direction,
the plurality of terminals each including a body held by the terminal holding part, an upper contact part protruding upward beyond an upper surface of the terminal unit, a lower contact part protruding downward beyond a lower surface of the terminal unit, an upper contact arm connecting the body and the upper contact part, and a lower contact arm connecting the body and the lower contact part; each of the upper and lower walls including a plurality of abutting parts which protrude therefrom in the lateral direction, the abutting parts being arranged adjacent to the terminal holding part in the vertical direction, each upper contact arm configured to abut against a respective one of the abutting parts protruding from the upper wall, each lower contact arm configured to abut against a respective one of the abutting parts protruding from the lower wall, each terminal holding part having a first engagement part at a first longitudinal end thereof, a second engagement part at a second, opposite longitudinal end thereof, and a beam which extends between the first and second engagement parts, the upper wall generally being positioned above the beam, the lower wall generally being positioned below the beam, each of the first and second engagement parts having a thickness in the lateral direction which is substantially equal to a thickness in the lateral direction of the beam and the side wall, when the upper and lower contact parts receive force in the vertical direction, the side wall receives force toward one side in the longitudinal direction.

9. The socket according to claim 8, wherein each of the first and second engagement parts has an engagement recess provided in a lower surface thereof, and wherein the frame member has an upper frame member and a lower frame member, wherein the lower frame member has first and second protrusions extending therefrom, wherein the first protrusion extends into the engagement recess of the first engagement part and wherein the second protrusion extends into the engagement recess of the second engagement part.

10. The socket according to claim 8, wherein each of the first and second engagement parts has a protrusion extending therefrom, and wherein the frame member has an upper frame member and a lower frame member, wherein the lower frame member has first and second engagement recesses provided in an upper surface thereof, wherein the first protrusion extends into the first engagement recess and wherein the second protrusion extends into the second engagement recess.

* * * * *